(12) United States Patent
Takahashi

(10) Patent No.: US 11,787,307 B2
(45) Date of Patent: Oct. 17, 2023

(54) SWITCH CONTROL DEVICE, SWITCH CONTROL METHOD, AND IN-VEHICLE POWER SUPPLY SYSTEM

(71) Applicant: Yazaki Corporation, Tokyo (JP)

(72) Inventor: Atsushi Takahashi, Susono (JP)

(73) Assignee: Yazaki Corporation, Tokyo (JP)

( * ) Notice: Subject to any disclaimer, the term of this patent is extended or adjusted under 35 U.S.C. 154(b) by 261 days.

(21) Appl. No.: 17/495,315

(22) Filed: Oct. 6, 2021

(65) Prior Publication Data
US 2022/0105830 A1 Apr. 7, 2022

(30) Foreign Application Priority Data
Oct. 7, 2020 (JP) .................. 2020-169870

(51) Int. Cl.
*B60L 58/20* (2019.01)
*B60L 58/12* (2019.01)
*H02J 7/00* (2006.01)

(52) U.S. Cl.
CPC ............... *B60L 58/20* (2019.02); *B60L 58/12* (2019.02); *H02J 7/0025* (2020.01); *H02J 2310/48* (2020.01)

(58) Field of Classification Search
CPC ........ B60L 58/20; B60L 58/12; H02J 7/0025; H02J 2310/48; Y02T 10/70; H03K 17/302
USPC .......................................................... 320/127
See application file for complete search history.

(56) References Cited

U.S. PATENT DOCUMENTS

| 2009/0302927 | A1 | 12/2009 | Doffin |
| 2013/0162029 | A1 | 6/2013 | Reichow et al. |
| 2022/0266718 | A1* | 8/2022 | Kadam .................. B60L 58/12 |
| 2023/0216437 | A1* | 7/2023 | Tsukamoto ............. B60L 58/20 |
| | | | 307/9.1 |

FOREIGN PATENT DOCUMENTS

JP   2013-522105 A   6/2013

OTHER PUBLICATIONS

Michel Burri Pascal Renard Ed-Darl Kuhn:"Enhanced Dynamic Range DAC Using PWM Technique", Ip.Com, Ip.Com Inc., West Henrietta, NY,US, Mar. 26, 2002.
David M Alter: "Using PWM Output as a Digital-to-Analog Converter on a TMS320F280x Digital Signal Controller", Sep. 30, 2008,pp. 1-32, Retrieved from the Internet: URL:http://www.ti.com/lit/an/spraa88a/spraa88a.pdf [retrieved on Apr. 2, 2014].

* cited by examiner

*Primary Examiner* — Paul Dinh
(74) *Attorney, Agent, or Firm* — Banner & Witcoff, Ltd.

(57) ABSTRACT

A MPU controls a changeover switch, which is an FET switch that connects a main battery and a sub-battery having a low rated voltage. The changeover switch is set to an ON state in a case where a potential difference, which is a difference between a voltage of the main battery and a voltage of the sub-battery, is equal to or greater than a positive first predetermined value. A PWM signal is output to a driver to cause the changeover switch to be in a half-ON state in a case where the potential difference is less than the first predetermined value and is greater than a second predetermined value equal to or less than 0. The changeover switch is set to an OFF state in a case where the potential difference is equal to or less than the second predetermined value.

5 Claims, 7 Drawing Sheets

SWITCH CONTROL DEVICE, SWITCH CONTROL METHOD, AND IN-VEHICLE POWER SUPPLY SYSTEM

CROSS-REFERENCE TO RELATED APPLICATIONS

This application is based on and claims priority under 35 USC 119 from Japanese Patent Application No. 2020-169870 filed on Oct. 7, 2020, the contents of which are incorporated herein by reference.

TECHNICAL FIELD

The present invention relates to a switch control device for a power supply, a switch control method, and an in-vehicle power supply system.

BACKGROUND ART

There has been known an in-vehicle power supply system including a first battery having a first rated voltage level, a second battery (or another storage medium) having a second rated voltage level lower than the first rated voltage level, and a control unit that connects the first battery and the second battery and manages energy exchange between the first battery and the second battery (see, for example, Patent Literature 1). In the control unit of the in-vehicle power supply system described in Patent Literature 1, if a voltage of the first battery is supplied to a non-inverting input side of a comparator, a voltage of the second battery is supplied to an inverting input side of the comparator, and the voltage of the first battery is higher than the voltage of the second battery, a switching element is controlled to be in a closed state by the comparator, and a polarity inversion protection diode is bridged. On the other hand, in a case where the voltage of the first battery decreases to a voltage threshold value lower than the voltage of the second battery, the switching element is controlled to be in an open state by the comparator, and outflow (reverse flow) of electric charges from the second battery to the first battery is prevented.

Patent Literature 1: JP-2013-522105-A

However, in the in-vehicle power supply system described in Patent Literature 1, an analog circuit including a comparator or the like is required, and the number of mounting components is increased, so that the size of a substrate is increased, and the cost is increased. This problem can be solved by changing to a control by software using a microprocessor. However, in a state in which the voltage of the first battery (hereinafter, referred to as a first power supply) becomes lower than the voltage of the second battery (hereinafter, referred to as a second power supply) and a reverse flow of the current from the second power supply to the first power supply can occur, a potential difference between the two power supplies is, for example, a very small amount of about several mV. Therefore, in the control by software using the microprocessor, it is not easy to detect the potential difference between the two power supplies. Therefore, it is not possible to deny a possibility that a timing at which the switching element (hereinafter referred to as a semiconductor switch) is actually controlled to be in the open state becomes after the reverse flow has occurred.

SUMMARY OF INVENTION

In view of the above circumstances, an object of the present invention is to provide a switch control device, a switch control method, and an in-vehicle power supply system that can suppress a reverse flow of a current from a second power supply to a first power supply without causing an increase in size and cost of a control circuit.

The switch control device according to the present invention is a switch control device for controlling a voltage-controlled type semiconductor switch, which connects a first power supply and a second power supply having a rated voltage lower than that of the first power supply and whose gate is driven by a gate drive voltage supplied from a gate drive circuit. The semiconductor switch is set to an ON state in a case where a potential difference $\Delta V$ (=V1−V2), which is a difference between a voltage V1 of the first power supply and a voltage V2 of the second power supply, is equal to or greater than a positive first predetermined value or is greater than the first predetermined value. A PWM signal is output to the gate drive circuit to cause the semiconductor switch to be in a continuous or intermittent half-ON state in a case of a first condition that the potential difference $\Delta V$ is less than the first predetermined value or is equal to or less than the first predetermined value and a second condition that the potential difference $\Delta V$ is greater than a second predetermined value of 0 or less or is equal to or greater than the second predetermined value. The semiconductor switch is set to an OFF state in a case where the potential difference $\Delta V$ is equal to or less than the second predetermined value or is less than the second predetermined value.

The switch control method according to the present invention is switch control method for controlling a voltage-controlled type semiconductor switch, which connects a first power supply and a second power supply having a rated voltage lower than that of the first power supply and whose gate is driven by a gate drive voltage supplied from a gate drive circuit, using a switch control device, the switch control method including: setting the semiconductor switch to an ON state in a case where a potential difference $\Delta V$ (=V1−V2), which is a difference between a voltage V1 of the first power supply and a voltage V2 of the second power supply, is equal to or greater than a positive first predetermined value or is greater than the first predetermined value; outputting a PWM signal to the gate drive circuit to cause the semiconductor switch to be in a continuous or intermittent half-ON state in a case of a first condition that the potential difference $\Delta V$ is less than the first predetermined value or is equal to or less than the first predetermined value and a second condition that the potential difference $\Delta V$ is greater than a second predetermined value of 0 or less or is equal to or greater than the second predetermined value; and setting the semiconductor switch to an OFF state in a case where the potential difference $\Delta V$ is equal to or less than the second predetermined value or is less than the second predetermined value.

The in-vehicle power supply system according to the present invention includes: the switch control device; the semiconductor switch controlled by the switch control device; the gate drive circuit configured to supply the gate drive voltage to the semiconductor switch; and the first power supply and the second power supply that are connected by the semiconductor switch.

DESCRIPTION OF EMBODIMENTS

Hereinafter, the present invention will be described in accordance with preferred embodiments. The present invention is not limited to the following embodiments, and can be appropriately changed without departing from the gist of the present invention. In addition, some configurations are not shown or described in the embodiments described below, but it goes without saying that a known or well-known technique is applied as appropriate to details of an omitted technique within a range in which no contradiction occurs to contents described below.

Figure 1:
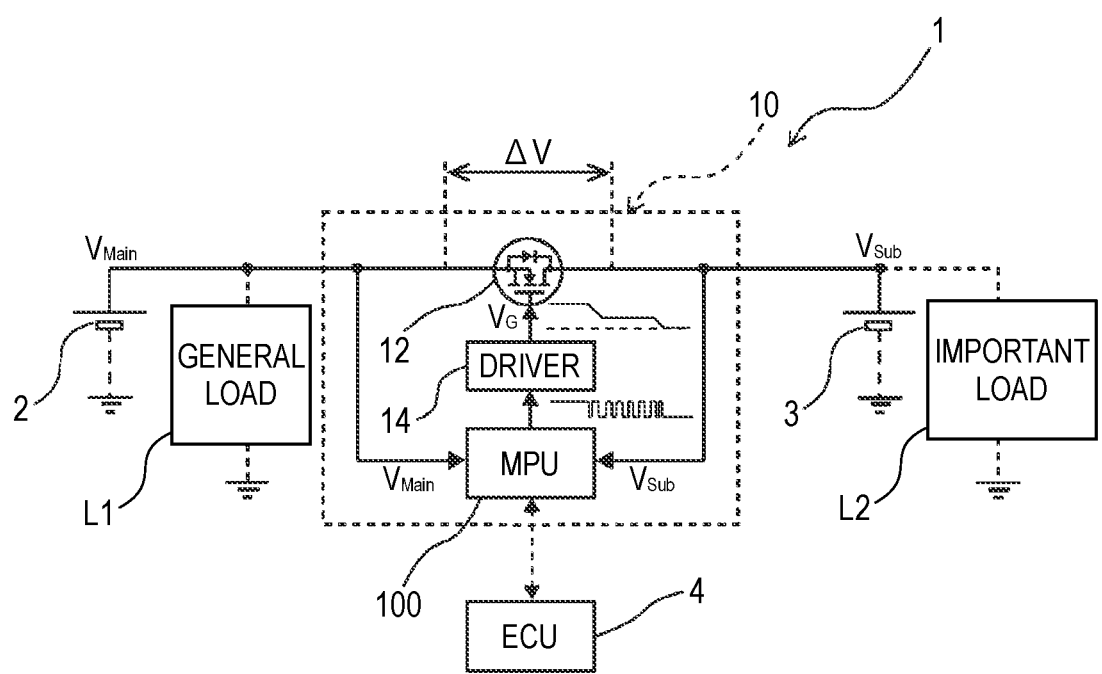
FIG. 1 is a diagram showing an in-vehicle power supply system including a switch control device according to an embodiment of the present invention.

FIG. 1 is a diagram showing an in-vehicle power supply system 1 including a switch control device according to an embodiment of the present invention. As shown in FIG. 1, the in-vehicle power supply system 1 includes a main battery 2, a sub-battery 3, and a switch unit 10. In the in-vehicle power supply system 1 according to the present embodiment, the main battery 2 is a regular power supply, and the sub-battery 3 is an emergency power supply. In addition, the sub-battery 3 is a backup battery that supplies power to an important load L2, and the main battery 2 is a battery that supplies power to a general load L1. A rated voltage of the sub-battery 3 is lower than a rated voltage of the main battery 2. The main battery 2 may be a traveling drive battery, and the sub-battery 3 may be an auxiliary machine drive battery. In addition, at least one of the main batteries 2 and the sub-battery 3 may be replaced with another power supply such as a capacitor.

The switch unit 10 includes a changeover switch 12, a driver 14 as a gale drive circuit, and a micro processing unit (MPU) 100 as the switch control device. The changeover switch 12 is a switch that connects the main battery 2 and the sub-battery 3 or disconnects the connection between the main battery 2 and the sub-battery 3. The changeover switch 12 is a voltage-controlled type semiconductor switch whose gate is driven by a gate drive voltage $V_G$ supplied from the driver 14, and is, for example, a field effect transistor such as a metal oxide semiconductor field effect transistor (MOSFET).

The driver 14 is a gate drive circuit including a resistor, a capacitor, and the like, and switches the gate drive voltage $V_G$ applied to the changeover switch 12 to a voltage at which the changeover switch 12 can be in an ON state, a voltage at which the changeover switch 12 can be in an OFF state, and a voltage at which the changeover switch 12 can be in a half-ON state in response to a control signal output from the MPU 100.

The MPU 100 outputs the control signal fir switching ON/OFF of the changeover switch 12 to the driver 14 in response to an ON/OFF instruction from an in-vehicle electronic control unit (ECU) 4. The ECU 4 outputs an instruction to turn on/off the changeover switch 12 to the MPU 100 at the time of initial processing (self-diagnosis, see FIG. 2) or the like after idling stop, power regeneration, or an ignition switch is turned on. In a normal state, the changeover switch 12 is set to the ON state, whereby electric power is supplied from the main battery 2 to the sub-battery 3, and the sub-battery 3 is charged. On the other hand, in a case where a power failure such as a ground fault occurs on the main battery 2 side, the changeover switch 12 is switched to the OFF state, so that the power supply from the sub-battery 3 to the important load L2 is maintained.

Since there is a parasitic capacitance between the gate and source of the FET such as the MOSFET, the changeover switch 12 can be brought into the half-ON state by performing a PWM control of switching the gate drive voltage $V_G$ applied to the changeover switch 12 between the voltage at which the changeover switch 12 can be in the ON state and the voltage at which the changeover switch 12 can be in the OFF state at a predetermined duty ratio. In the switch unit 10 according to the present embodiment, the MPU 100 monitors a potential difference ΔV ($=V_{Main}-V_{Sub}$) between a voltage $V_{Main}$ of the main battery 2 and a voltage $V_{Sub}$ of the sub-battery 3, and outputs a PWM signal to the driver 14 in a case where the potential difference ΔV satisfies a condition of the following formula (1). Note that $V_{det}$ is a positive first predetermined value, $V_{Shut}$ is a second predetermined value equal to or less than 0, and the details will be described later.

$$V_{Shut} < \Delta V < V_{det} \qquad (1)$$

A condition for the MPU 100 to output the PWM signal is not limited to a condition of the formula (1), and may be conditions of the following formulas (2) to (4).

$$V_{Shut} < \Delta V \leq V_{det} \qquad (2)$$

$$V_{Shut} \leq \Delta V \leq V_{det} \qquad (3)$$

$$V_{Shut} \leq \Delta V < V_{det} \qquad (4)$$

In a case where the potential difference ΔV satisfies a condition of the following formula (5), the MPU 100 switches the changeover switch 12 from the half-ON state to the OFF state.

$$\Delta V < V_{Shut} \qquad (5)$$

A condition for switching the changeover switch 12 from the half-ON state to the OFF state by the MPU 100 is not limited to the condition of the above formula (5), and may be a condition of the following formula (6).

$$\Delta V < V_{Shut} \qquad (6)$$

Figure 2:
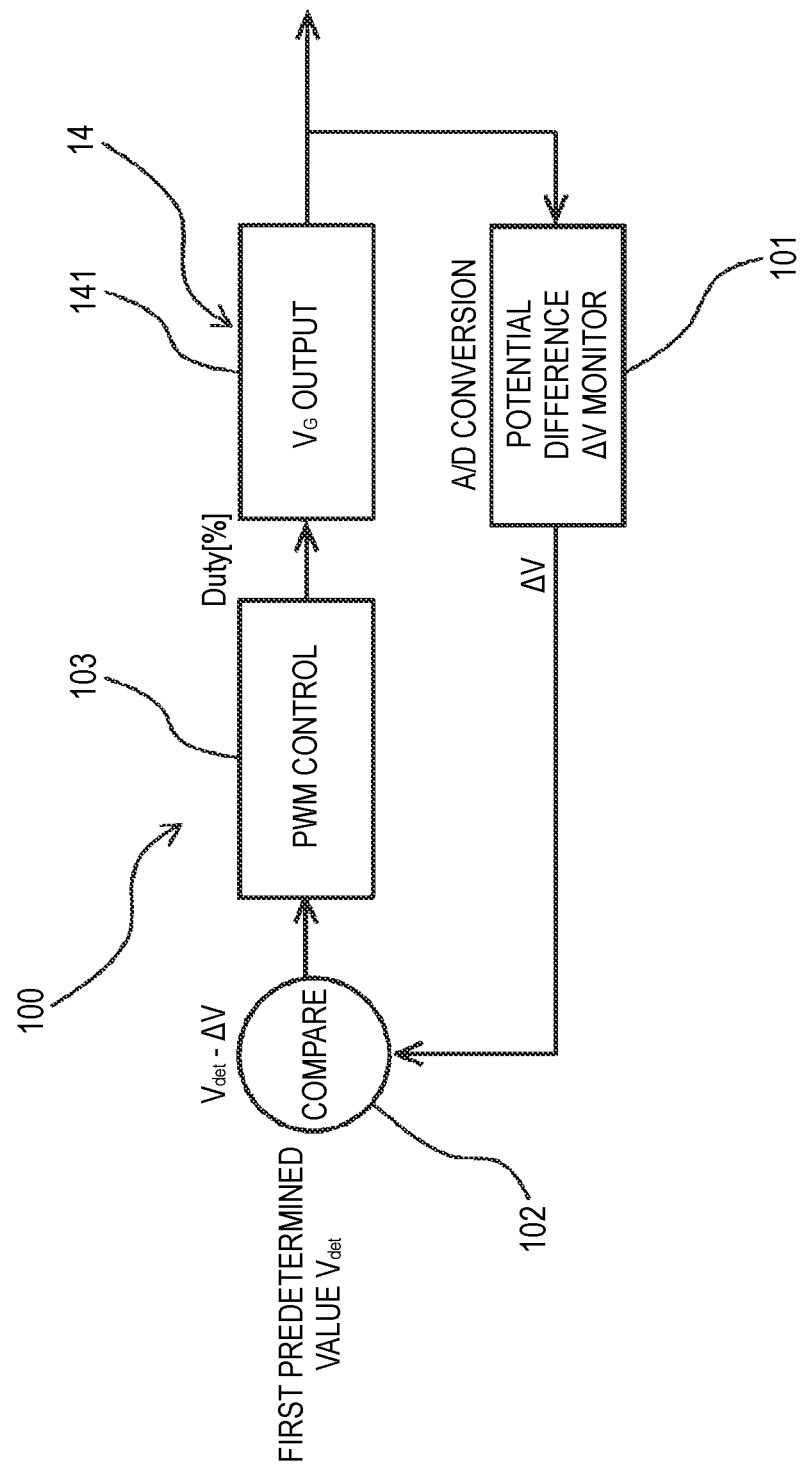
FIG. 2 is a block diagram showing functions of an MPU and a driver shown in FIG. 1.

FIG. 2 is a block diagram showing functions of the MPU 100 and the driver 14 shown in FIG. 1. As shown in FIG. 2, the MPU 100 stores a program for executing a potential difference ΔV monitor function 101, a comparison function 102, and a PWM control function 103. The potential difference ΔV monitor function 101 is a function of monitoring the potential difference ΔV. The comparison function 102 is a function of comparing the potential difference ΔV with the first predetermined value $V_{det}$. The PWM control function 103 is a function of performing the PWM control. In addition, the driver 14 executes a $V_G$ output function 141 that outputs the gate drive voltage $V_G$.

The potential difference $\Delta V$ monitor function 101 performs A/D conversion on detection signals of the voltage $V_{Main}$ of the main battery 2 and the voltage $V_{Sub}$ of the sub-battery 3, and calculates the potential difference $\Delta V$. The comparison function 102 calculates a difference ($V_{det}-\Delta V$) between the first predetermined value $V_{det}$ and the potential difference $\Delta V$ calculated by the potential difference $\Delta V$ monitor function 101, and outputs the difference to the PWM control function 103.

In a case where a value ($V_{det}-\Delta V$) output from the comparison function 102 is a positive value (that is, $\Delta V<V_{det}$), the PWM control function 103 generates a PWM signal having a duty ratio of 10% to 90% and outputs the PWM signal to the $V_G$ output function 141 of the driver 14. On the other hand, in a case where the value ($V_{det}-\Delta V$) output from the comparison function 102 is a value equal to or less than 0 (that is, $\Delta V \geq V_{det}$), the PWM control function 103 generates an ON signal, which is a PWM signal having a duty ratio of 100%, and outputs the ON signal to the $V_G$ output function 141 of the driver 14.

The $V_G$ output function 141 of the driver 14 outputs the gate drive voltage $V_G$ corresponding to the duty ratio of the PWM signal output from the PWM control function 103 to the changeover switch 12. In a case where the duty ratio of the PWM signal is 100%, the gate drive voltage $V_G$ becomes a voltage sufficient to turn on the changeover switch 12, and in a case where the duty ratio of the PWM signal is 0%, the gate drive voltage $V_G$ becomes a voltage sufficient to turn off the changeover switch 12. As will be described in detail later, in the case where the duty ratio of the PWM signal is 10% to 90%, resistance between the gate and the source of the changeover switch 12 becomes higher as compared with the case where the duty ratio of the PWM signal is 100%. On the other hand, a current flowing through the changeover switch 12 is constant. Therefore, in the case where the duty ratio of the PWM signal is 10% to 90%, the gate drive voltage $V_G$ becomes an intermediate voltage between a voltage sufficient to turn on the changeover switch 12 and a voltage sufficient to turn off the changeover switch 12.

Figure 3:
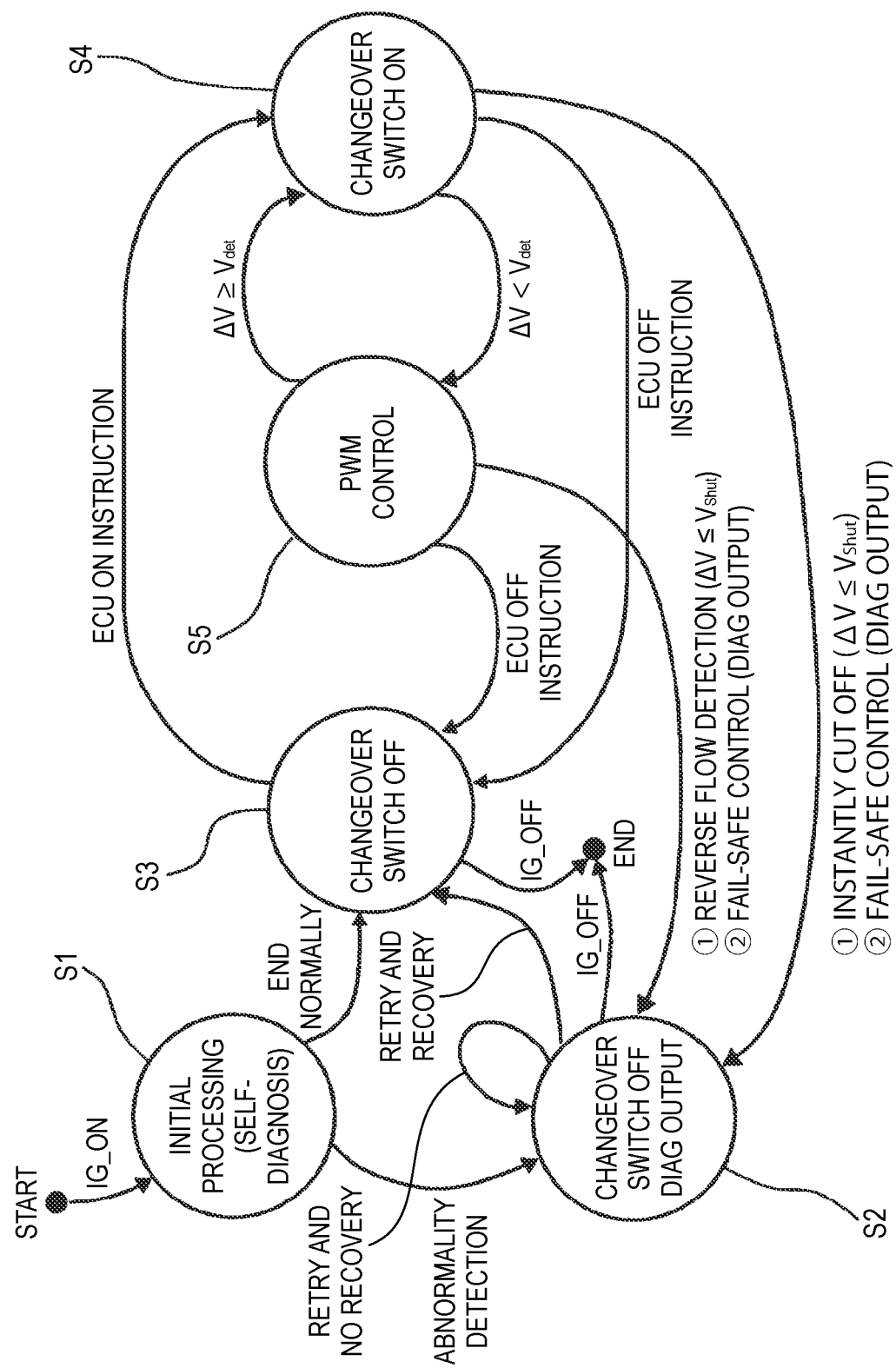
FIG. 3 is a diagram showing a state transition of a switch unit shown in FIG. 1.

FIG. 3 is a diagram showing a state transition of the switch unit 10 shown in FIG. 1. As shown in FIG. 3, when an ignition switch of a vehicle is turned on (IG_ON), a start state is set, and the state transitions to a state (S1) in which the initial processing (self-diagnosis) of the ECU 4 is executed. In the state of S1, in a case where an abnormality such as a power failure is detected, the state transitions to a state (S2) in which a fail-safe control (DIAG output) for turning off the changeover switch 12 is executed. In the state of S2, the retry is repeated until self-recovery.

In a case where the initial processing ends normally or the self-recovery is performed from the abnormality detection, the ECU 4 makes a transition to a state (S3) in which the changeover switch 12 is turned off. When the ignition switch is turned off (IG_OFF) from the state of S3, the state transitions to an end state (END). In addition, when the ignition switch is turned off (IG_OFF) from the state (S2) after the abnormality detection, the state also transitions to the end state (END).

When an instruction (ECU ON instruction) to turn on the changeover switch 12 is outputted from the ECU 4 in the OFF state (S3) of the changeover switch 12, the MPU 100 makes a transition to a state (S4) in which the changeover switch 12 is turned on. In addition, when an instruction to turn off the changeover switch 12 (ECU OFF instruction) is outputted from the ECU 4 in the state (S4) in which the changeover switch 12 is ON, the changeover switch 12 shifts to the OFF state (S3).

In a case where the potential difference $\Delta V$ becomes less than the first predetermined value $V_{det}$ in the ON state (S4) of the changeover switch 12 ($\Delta V<\Delta V_{det}$), the state transitions to a state (S5) in which the PWM control is executed. In the state (S5) in which the PWM control is executed, when an instruction (ECU OFF instruction) to turn off the changeover switch 12 is outputted from the ECU 4, the changeover switch 12 transitions to the OFF state (S3). In the state (S5) where the PWM control is executed, in a case where the potential difference $\Delta V$ is equal to or greater than the first predetermined value $V_{det}$ ($\Delta V \geq \Delta V_{det}$), the changeover switch 12 transitions to the ON state (S4).

In a case where the potential difference $\Delta V$ is equal to or less than the second predetermined value $V_{Shut}$ ($\Delta V \leq V_{Shut}$) in the state (S5) in which the PWM control is executed, the changeover switch 12 transitions to the OFF state (S2). At this time, the MPU 100 executes the fail-safe control (DIAG output). Also, in the case where the potential difference $\Delta V$ is equal to or less than the second predetermined value $V_{Shut}$ in the ON state (S4) of the changeover switch 12, the changeover switch 12 transitions to the OFF state (S2). At this time, the ECU 4 executes the fail-safe control (DIAG output).

Figure 4:
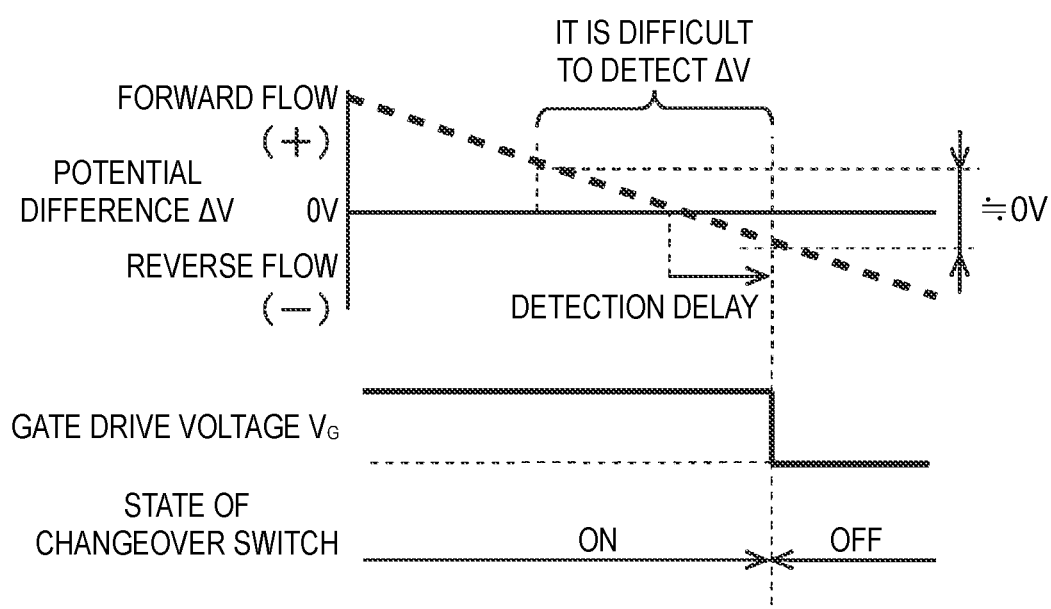
FIG. 4 is a timing chart showing a relationship among a potential difference ΔV, a gate drive voltage $V_G$, and a state of a changeover switch in a case where a PWM control is not performed.
Figure 5:
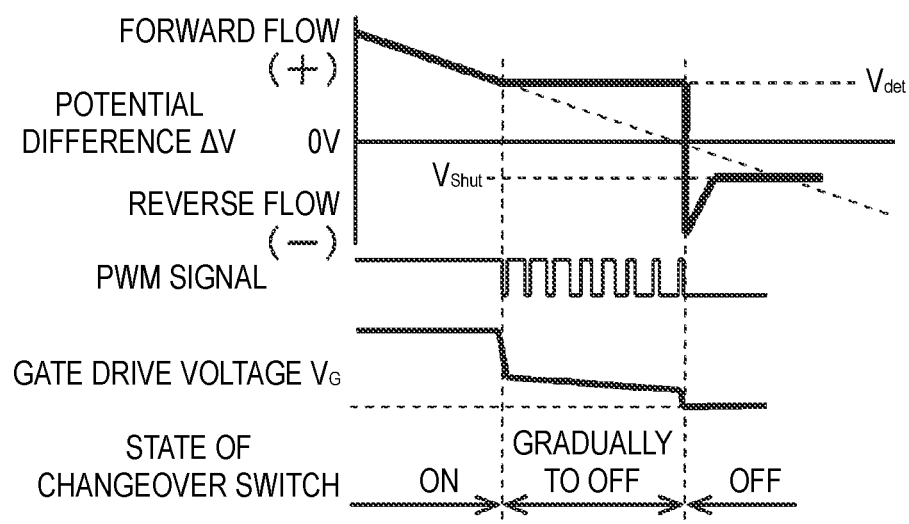
FIG. 5 is a timing chart showing a relationship among the potential difference ΔV, a PWM signal, the gate drive voltage $V_G$, and the state of the changeover switch in a case where the PWM control is performed.

FIG. 4 is a timing chart showing a relationship among the potential difference $\Delta V$, the gate drive voltage $V_G$, and the state of the changeover switch 12 in a case where the PWM control is not performed. FIG. 5 is a timing chart showing the relationship among the potential difference $\Delta V$, the PWM signal, the gate drive voltage $V_G$, and the state of the changeover switch 12 in a case where the PWM control is performed.

As shown in the timing chart of FIG. 4, in the case where the PWM control is not performed, when the voltage $V_{Main}$ of the main battery 2 decreases due to a power failure of the main battery 2 or the like, the potential difference $\Delta V$ (indicated by a broken line) decreases from a positive value to a negative value. When the potential difference $\Delta V$ is a positive value, a forward flow state in which the current flows from the main battery 2 side to the sub-battery 3 side occurs, and when the potential difference $\Delta V$ is a negative value, a reverse flow state in which the current flows from the sub-battery 3 side to the main battery 2 side occurs.

Here, since the potential difference $\Delta V$ immediately before and after the transition from the forward flow state to the reverse flow state is very small ($\approx 0$ V), it is difficult for the MPU 100 to detect the potential difference $\Delta V$. Therefore, in the case where the PWM control is not performed, it is difficult for the MPU 100 to determine which of the forward flow state and the reverse flow state is present, immediately before and after the transition from the forward flow state to the reverse flow state. Therefore, in a case where the changeover switch 12 is switched based on the potential difference $\Delta V$ without performing the PWM control, there is a possibility that a detection delay occurs in which it is detected that the potential difference $\Delta V$ is a negative value after the transition from the forward flow state to the reverse flow state, and the changeover switch 12 is switched to OFF after the transition from the forward flow state to the reverse flow state.

On the other hand, as shown in the timing chart of FIG. 5, in the case where the PWM control is performed after the potential difference $\Delta V$ (indicated by a solid line) decreases to the first predetermined value due to a power failure of the main battery 2 or the like, the potential difference $\Delta V$ is maintained at the first predetermined value $V_{det}$, which is a positive value, in the forward flow state, and sharply drops to a value equal to or less than 0 at the moment of transition from the forward flow state to the reverse flow state. Then, after the potential difference ΔV decreases to the second predetermined value $V_{Shut}$, which is a value equal to or less than 0, the changeover switch 12 is switched to OFF.

Here, when the PWM signal having the duty ratio of 10% to 90% is output to the driver 14 after the potential difference ΔV decreases to the first predetermined value $V_{det}$, resistance value between the gate and the source of the changeover switch 12 becomes higher as compared with the case where the duty ratio of the PWM signal is 100% (that is, the changeover switch 12 is ON). On the other hand, a current value of the current flowing from the main battery 2 side to the sub-battery 3 side is constant. Therefore, the gate drive voltage $V_G$ is set to an intermediate value between the voltage for ON and the voltage for OFF, so that the changeover switch 12 becomes in the half-ON state, and the potential difference ΔV is brought close to the first predetermined value $V_{det}$. Further, at the moment of transition from the forward flow state to the reverse flow state, no current flows from the main battery 2 side to the sub-battery 3 side, so that the gate drive voltage $V_G$ becomes 0 regardless of the resistance value between the gate and the source of the changeover switch 12, and the potential difference ΔV rapidly drops from the first predetermined value $V_{det}$ to a value equal to or less than 0. The changeover switch 12 is switched from ON to OFF when the potential difference ΔV decreases to the second predetermined value $V_{Shut}$ that is a value equal to or less than 0. Therefore, in the case where the changeover switch 12 is switched based on the potential difference ΔV while performing the PWM control, the potential difference ΔV sharply drops at the moment of transition from the forward flow state to the reverse flow state, and therefore, the above-described detection delay can be suppressed by detecting the rapid drop of the potential difference ΔV, and the switching switch 12 can be switched from the half-ON state to the OFF state at the moment of transition from the forward flow state to the reverse flow state.

Figure 6:
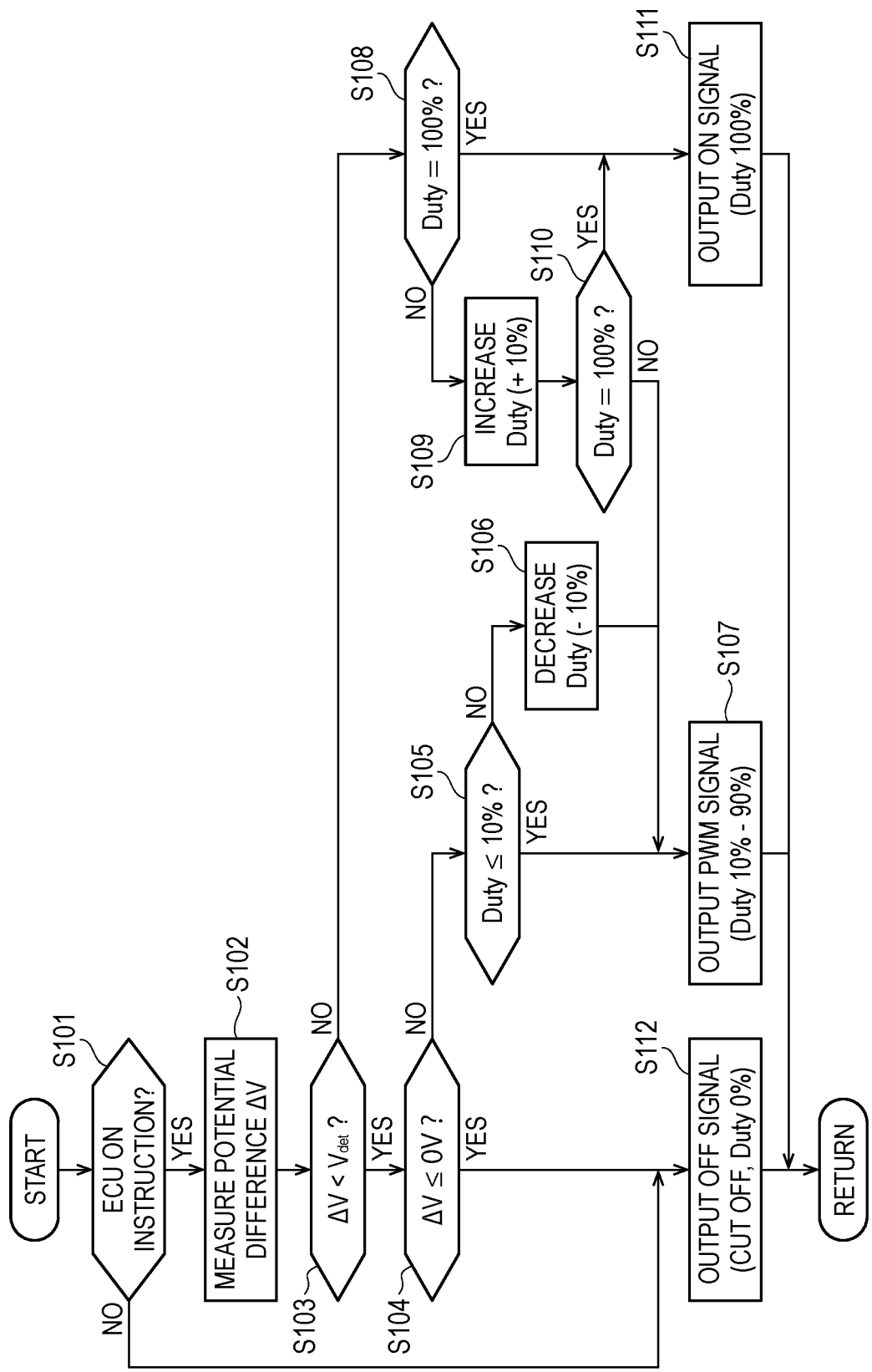
FIG. 6 is a flowchart showing processing of the MPU shown in FIG. 1.

FIG. 6 is a flowchart showing processing of the MPU 100 shown in FIG. 1. As shown in the flowchart of FIG. 6, in step 101, the MPU 100 determines whether the ON instruction is received from the ECU 4. In a case where an affirmative determination is made in step 101, the process proceeds to step 102, and in a case where a negative determination is made in step 101, the process proceeds to step 112.

In step 102, the MPU 100 measures the potential difference ΔV. The process proceeds from step 102 to step 103. In step 103, the MPU 100 determines whether the potential difference ΔV measured in step 102 is less than the first predetermined value $V_{det}$. In a case where an affirmative determination is made in step 103, the process proceeds to step 104, and in a case where a negative determination is made in step 103, the process proceeds to step 108.

In step 104, the MPU 100 determines whether the potential difference ΔV measured in step 102 is equal to or less than 0 V (second predetermined value $V_{Shut}$). In a case where an affirmative determination is made in step 104, the process proceeds to step 112, and in a case where a negative determination is made in step 104, the process proceeds to step 105.

In step 105, the MPU 100 determines whether the duty ratio of the PWM signal is set to 10% or less. In a case where an affirmative determination is made in step 105, the process proceeds to step 107, and in a case where a negative determination is made in step 105, the process proceeds to step 106.

In step 106, the MPU 100 decreases the duty ratio of the PWM signal by 10%. The process proceeds from step 106 to step 107. In step 107, the MPU 100 generates a PWM signal having a duty ratio of 10% to 90% and outputs the PWM signal to the driver 14. Note that the duty ratio of the PWM signal is set, from 10% of the minimum value to 90% of the maximum value, to 20%, 30%, . . . , 70%, 80%, at 10% intervals. Therefore, in a case where the duty ratio of the PWM signal is greater than 10% in step 105, the minimum value of the duty ratio of the PWM signal is 20%.

In the case where the potential difference ΔV is equal to or greater than the first predetermined value $V_{det}$ the MPU 100 determines in step 108 whether the duty ratio of the PWM signal is set to 100%. In a case where a negative determination is made in step 108, the process proceeds to step 109, and in a case where an affirmative determination is made in step 108, the process proceeds to step 111.

In step 109, the MPU 100 increases the duty ratio of the PWM signal by 10%. The process proceeds from step 109 to step 110. In step 110, the MPU 100 determines whether the duty ratio of the PWM signal is set to 100%. In a case where a negative determination is made in step 110, the process proceeds to step 107, and in a case where an affirmative determination is made in step 110, the process proceeds to step 111. In step 111, the MPU 100 outputs the ON signal (PWM signal having the duty ratio of 100%) to the driver 14.

In the case where the potential difference ΔV is equal to or less than 0 V (second predetermined value $V_{Shut}$), in step 112, the MPU 100 turns off (cuts off, a PWM signal having the duty ratio of 0%) the changeover switch 12. The above-described processing of steps 101 to 112 is repeatedly executed while the ignition switch of the vehicle is turned on.

As described above, in the MPU 100 according to the present embodiment, the potential difference ΔV is maintained at the positive first predetermined value $V_{det}$ with the changeover switch 12 being in the half-ON state under the control by the software called the PWM control, whereby the potential difference ΔV rapidly drops to the second predetermined value $V_{Shut}$ equal to or less than 0 at the moment when the current flowing through the changeover switch 12 transitions from the forward flow state to the reverse flow state. By detecting the rapid drop of the potential difference ΔV and switching the changeover switch 12 to the OFF state, the detection delay of the reverse flow state can be suppressed. Therefore, the reverse flow from the sub-battery 3 to the main battery 2 can be suppressed without increasing the size and cost of a control circuit.

In particular, since the switch unit 10 according to the present embodiment performs the control by software using the microprocessor that has been mounted as the switch control device of the changeover switch in the related art, the control circuit can be reduced in size and the cost can be reduced as compared with a case of using an analog circuit.

In the switch unit 10 according to the present embodiment, since the changeover switch 12 is an FET switch (field effect transistor switch), it is easy to set the changeover switch 12 to the half-ON state, and a control for maintaining the potential difference ΔV at the first predetermined value $V_{det}$ can be preferably performed.

Figure 7:
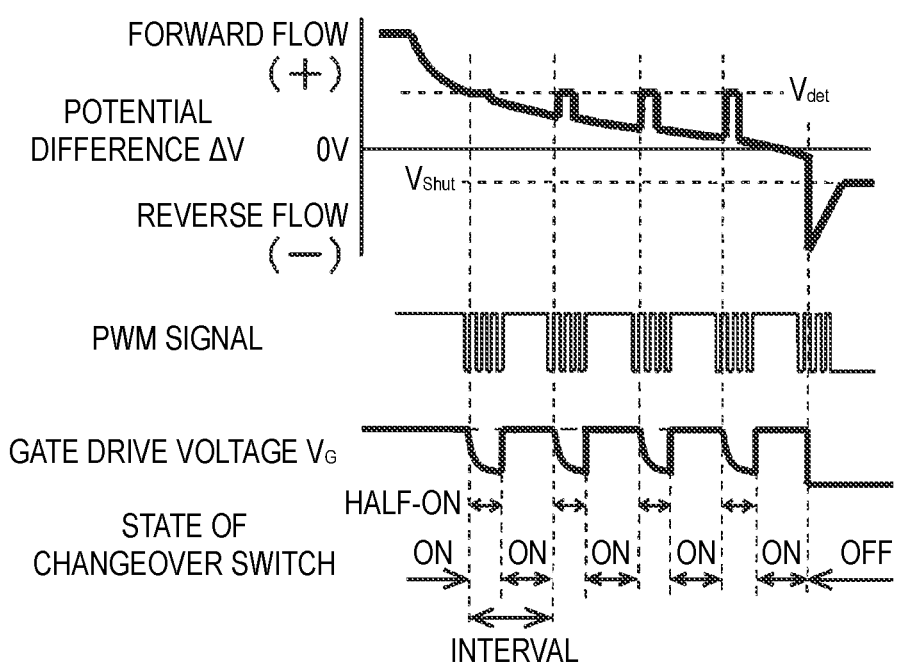
FIG. 7 is a timing chart showing a relationship among a potential difference ΔV a PWM signal, a gate drive voltage $V_G$, and a state of a changeover switch in a case where a PWM control according to another embodiment of the present invention is performed.

FIG. 7 is a timing chart showing a relationship among the potential difference ΔV, the PWM signal, the gate drive voltage $V_G$, and the state of the changeover switch 12 in the case where a PWM control according to another embodiment of the present invention is performed. As shown in this timing chart, in the present embodiment, in the case where the potential difference ΔV (indicated by a solid line) is greater than the second predetermined value $V_{Shut}$ and less than the first predetermined value $V_{det}$, the PWM control is intermittently performed. That is, an interval control in which the half-ON state and the ON state of the changeover switch 12 are repeated in a predetermined period is performed. The period of the interval is, for example, 500 μs to 1 ms.

Here, when a voltage-controlled type semiconductor switch such as an FET switch is in the half-ON state, a heat generation amount increases due to an increase in the resistance value. Therefore, in the present embodiment, time of the half-ON state of the changeover switch 12 is shortened by intermittently changing the half-ON state of the changeover switch 12 instead of continuously, thereby suppressing the heat generation of the changeover switch 12.

Although the present invention has been described based on the embodiments, the present invention is not limited to the embodiment described above. The present invention may be modified as appropriate without departing from the gist of the present invention, or known and well-known techniques may be combined as appropriate.

In the switch control device according to the present invention, in a case where the potential difference ΔV is less than the first predetermined value or equal to or less than the first predetermined value and the potential difference ΔV is greater than the second predetermined value or equal to or greater than the second predetermined value, the PWM signal and the ON signal may be alternately transmitted to the gate drive circuit to alternately switch the semiconductor switch between the half-ON state and the ON state.

In the switch control device according to the present invention, the semiconductor switch may be a field effect transistor switch.

According to the present invention, by maintaining the potential difference ΔV at the positive first predetermined value with the semiconductor switch being in the half-ON state under the control by software called the PWM control, the potential difference ΔV rapidly drops to the second predetermined value equal to or less than 0 at the moment when the current flowing through the semiconductor switch transitions from the forward flow state to the reverse flow state. By detecting the rapid drop of the potential difference ΔV and switching the semiconductor switch to the OFF state, the detection delay of the reverse flow state can be suppressed. Therefore, the reverse flow from the second power supply to the first power supply can be suppressed without increasing the size and cost of the control circuit.

What is claimed is:

1. A switch control device for controlling a voltage-controlled type semiconductor switch, which connects a first power supply and a second power supply having a rated voltage lower than that of the first power supply and whose gate is driven by a gate drive voltage supplied from a gate drive circuit,
   wherein the semiconductor switch is set to an ON state in a case where a potential difference ΔV is equal to or greater than a positive first predetermined value or is greater than the first predetermined value, the potential difference ΔV being a difference between a voltage V1 of the first power supply and a voltage V2 of the second power supply,
   wherein a PWM signal is output to the gate drive circuit to cause the semiconductor switch to be in a continuous or intermittent half-ON state in a case of a first condition that the potential difference ΔV is less than the first predetermined value or is equal to or less than the first predetermined value and a second condition that the potential difference ΔV is greater than a second predetermined value of 0 or less or is equal to or greater than the second predetermined value, and
   wherein the semiconductor switch is set to an OFF state in a case where the potential difference ΔV is equal to or less than the second predetermined value or is less than the second predetermined value.

2. The switch control device according to claim 1,
   wherein the PWM signal and an ON signal are alternately transmitted to the gate drive circuit so as to alternately switch the semiconductor switch between the half-ON state and the ON state, in the case where the potential difference ΔV is less than the first predetermined value or equal to or less than the first predetermined value and the potential difference ΔV is greater than the second predetermined value or equal to or greater than the second predetermined value.

3. The switch control device according to claim 1,
   wherein the semiconductor switch is a field effect transistor switch.

4. A switch control method for controlling a voltage-controlled type semiconductor switch, which connects a first power supply and a second power supply having a rated voltage lower than that of the first power supply and whose gate is driven by a gate drive voltage supplied from a gate drive circuit, using a switch control device, the switch control method comprising:
   setting the semiconductor switch to an ON state in a case Where a potential difference ΔV is equal to or greater than a positive first predetermined value or is greater than the first predetermined value, the potential difference ΔV being a difference between a voltage V1 of the first power supply and a voltage V2 of the second power supply;
   outputting a PWM signal to the gate drive circuit to cause the semiconductor switch to be in a continuous or intermittent half-ON state in a case of a first condition that the potential difference ΔV is less than the first predetermined value or is equal to or less than the first predetermined value and a second condition that the potential difference ΔV is greater than a second predetermined value of 0 or less or is equal to or greater than the second predetermined value; and
   setting the semiconductor switch to an OFF state in a case where the potential difference ΔV is equal to or less than the second predetermined value or is less than the second predetermined value.

5. An in-vehicle power supply system comprising:
   the switch control device according to claim 1;
   the semiconductor switch controlled by the switch control device;
   the gate drive circuit configured to supply the gate drive voltage to the semiconductor switch; and
   the first power supply and the second power supply that are connected by the semiconductor switch.

* * * * *